United States Patent
Lung

(10) Patent No.: US 7,646,631 B2
(45) Date of Patent: Jan. 12, 2010

(54) PHASE CHANGE MEMORY CELL HAVING INTERFACE STRUCTURES WITH ESSENTIALLY EQUAL THERMAL IMPEDANCES AND MANUFACTURING METHODS

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 93 days.

(21) Appl. No.: 11/952,646

(22) Filed: Dec. 7, 2007

(65) Prior Publication Data

US 2009/0147564 A1 Jun. 11, 2009

(51) Int. Cl.
*G11C 11/00* (2006.01)
(52) U.S. Cl. .................. 365/163; 365/148; 365/185.19; 365/63
(58) Field of Classification Search .................. 365/163, 365/148, 185.19, 63, 51, 211; 257/2–5
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |

(Continued)

FOREIGN PATENT DOCUMENTS

CN 1462478 12/2003

(Continued)

OTHER PUBLICATIONS

"Magnetic Bit Boost," www.sciencenews.org, Dec. 18 & 25, 2004, p. 389, vol. 166.

(Continued)

*Primary Examiner*—David Lam
(74) *Attorney, Agent, or Firm*—Haynes Beffel & Wolfeld LLP

(57) ABSTRACT

A memory device as described herein includes a memory member contacting first and second interface structures. The first interface structure electrically and thermally couples the memory member to access circuitry and has a first thermal impedance therebetween. The second interface structure electrically and thermally couples the memory member to a bit line structure and has a second thermal impedance therebetween. The first and second thermal impedances are essentially equal such that applying a reset pulse results in a phase transition of an active region of the memory member spaced away from both the first and second interface structures.

20 Claims, 11 Drawing Sheets

U.S. PATENT DOCUMENTS

| | | | |
|---|---|---|---|
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,066,870 A | 5/2000 | Siek |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,316,348 B1 | 11/2001 | Fu et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,744,088 B2 | 6/2004 | Dennison |
| 6,746,892 B2 | 6/2004 | Lee et al. |
| 6,750,079 B2 | 6/2004 | Lowrey et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi et al. |
| 6,808,991 B1 | 10/2004 | Tung et al. |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,864 B2 | 6/2006 | Nishida et al. |
| 7,067,865 B2 | 6/2006 | Lung et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,164,147 B2 | 1/2007 | Lee et al. |
| 7,166,533 B2 | 1/2007 | Happ |
| 7,214,958 B2 | 5/2007 | Happ |
| 7,220,983 B2 | 5/2007 | Lung |
| 7,277,317 B2 | 10/2007 | Le Phan et al. |
| 7,400,522 B2 * | 7/2008 | Toda et al. .................. 365/148 |
| 7,502,252 B2 * | 3/2009 | Fuji et al. .................. 365/163 |
| 2001/0055838 A1 | 12/2001 | Walker et al. |
| 2002/0070457 A1 | 6/2002 | Sun et al. |
| 2002/0072223 A1 | 6/2002 | Gilbert et al. |
| 2002/0081833 A1 | 6/2002 | Li et al. |
| 2002/0113273 A1 | 8/2002 | Hwang et al. |
| 2002/0182835 A1 | 12/2002 | Quinn |
| 2003/0095426 A1 | 5/2003 | Hush et al. |
| 2004/0026686 A1 | 2/2004 | Lung |
| 2004/0051094 A1 | 3/2004 | Ooishi |
| 2004/0051161 A1 | 3/2004 | Tanaka et al. |
| 2004/0113232 A1 | 6/2004 | Johnson et al. |
| 2004/0165422 A1 | 8/2004 | Hideki et al. |
| 2004/0178172 A1 | 9/2004 | Huang et al. |
| 2004/0208038 A1 | 10/2004 | Idehara |
| 2005/0018526 A1 | 1/2005 | Lee |
| 2005/0019975 A1 | 1/2005 | Lee et al. |
| 2005/0029502 A1 | 2/2005 | Hudgens |
| 2005/0062087 A1 | 3/2005 | Chen et al. |
| 2005/0093022 A1 | 5/2005 | Lung |

| | | |
|---|---|---|
| 2005/0106919 A1 | 5/2005 | Layadi et al. |
| 2005/0130414 A1 | 6/2005 | Choi et al. |
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0215009 A1 | 9/2005 | Cho |
| 2005/0285096 A1 | 12/2005 | Kozicki |
| 2006/0038221 A1 | 2/2006 | Lee et al. |
| 2006/0043617 A1 | 3/2006 | Abbott |
| 2006/0073642 A1 | 4/2006 | Yeh et al. |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0110888 A1 | 5/2006 | Cho et al. |
| 2006/0118913 A1 | 6/2006 | Yi et al. |
| 2006/0154185 A1 | 7/2006 | Ho et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0224726 A1 | 9/2007 | Chen et al. |
| 2007/0235811 A1 | 10/2007 | Furukawa et al. |
| 2007/0246699 A1 | 10/2007 | Lung |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0014676 A1 | 1/2008 | Lung et al. |

FOREIGN PATENT DOCUMENTS

| | | |
|---|---|---|
| WO | WO-0079539 | 12/2000 |
| WO | WO-0145108 | 6/2001 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2 pp.

Adler, D. et al., "Threshold Switching in Chalcogenide-Glass Thin Films," J. Appl/ Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "Highly Reliable 5nm Contact Cell Technology for 256Mb PRAM," VLSI Technology, Digest of Technical Papers, Jun. 14-16, 2005, pp. 98-99.

Ahn, S.J. et al., "A Highly Manufacturable High Density Phase Change Memory of 64 Mb and Beyond," IEEE IEDM 2004, pp. 907-910.

Atwood, G, et al., "90nm Phase Change Technology with µ Trench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phrase Change Memory Cell with Double GST Thermally Confined Structure," Int'l Symp on VLSI Technology, Systems and Applications, Apr. 23-25, 2007, pp. 1-2.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 µm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurments of Thin Films Silicon Dioxide", Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search=nonvolatile%20high%20density%20high%20performance%20phase%20change%20memory, 8 pages.

Wicker, Guy, "A Comprehensive Model of Submicron Chalcogenide Switching Devices," Doctoral Dissertation, Wayne State University, Detroit, MI, 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

PHASE CHANGE MEMORY CELL HAVING INTERFACE STRUCTURES WITH ESSENTIALLY EQUAL THERMAL IMPEDANCES AND MANUFACTURING METHODS

PARTIES TO A JOINT RESEARCH AGREEMENT

International Business Machines Corporation, a New York corporation; Macronix International Corporation, Ltd., a Taiwan R.O.C. corporation, and Infineon Technologies A.G., a German corporation, are parties to a Joint Research Agreement.

BACKGROUND OF THE INVENTION

1. Field of the Invention

The present invention relates to high density memory devices based on programmable resistive memory materials, including phase change materials like chalcogenides and others, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. Thus, phase change materials can be characterized as a type of programmable resistive memory material. These properties have generated interest in using phase change material and other programmable resistive memory material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change structure to stabilize in the amorphous state. It is desirable to minimize the magnitude of the reset current used to cause the transition of the phase change material from a crystalline state to an amorphous state. The memory cells using phase change material include an "active region" in the bulk of the phase change material of the cell in which the actual phase transitions are located. Techniques are applied to make the active region small, so that the amount of current needed to induce the phase change is reduced. Also, techniques are used to thermally isolate the active region in the phase change cell so that the resistive heating needed to induce the phase change is confined to the active region.

The magnitude of the reset current needed for reset can also be reduced by reducing the size of the phase change material element in the cell and/or the contact area between electrodes and the phase change material, such that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Another technology developed by the assignee of the present application is referred to as a phase change bridge cell, in which a very small patch of memory material is formed as a bridge across a thin film insulating member located between electrodes. The phase change bridge is easily integrated with logic and other types of circuitry on integrated circuits. See, U.S. application Ser. No. 11/155,067, filed 17 Jun. 2005, entitled "Thin Film Fuse Phase Change RAM and Manufacturing Method," by Lung et al., incorporated by reference as if fully set forth herein, which application was owned at the time of invention and is currently owned by the same assignee.

Yet another approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

One approach to the heat flow problem is seen in U.S. Pat. No. 6,815,704, entitled "Self Aligned Air-Gap Thermal Insulation for Nano-scale Insulated Chalcogenide Electronics (NICE) RAM", in which an attempt is made to isolate the memory cell using gaps or voids on the sides of the phase change material. It has also been proposed to use thermally insulating materials to improve the confinement of heat to the active region.

Also, approaches to improving thermal isolation include forming the phase change element in a way that tends to isolate the active region from the electrodes, as shown for example in U.S. patent application Ser. No. 11/348,848, filed 7 Feb. 2006, entitled "I-Shaped Phase Change Memory Cell" by Chen et al., incorporated by reference as if fully set forth herein, which application was owned at the time of invention and is currently owned by the same assignee.

FIG. 1 illustrates a cross-sectional view of a portion of a prior art memory cell 100 including a memory member 110 comprising memory material having an active region 120 adjacent to a first interface structure 130. The memory member 110 makes electrical and thermal contact with the first interface structure 130, and also makes electrical and thermal contact with the second interface structure 140. The memory member 110 is surrounded by a dielectric 165 that acts to provide some thermal isolation to the memory member 110.

First interface structure 130 comprises a first conductive member 132 and a contact area 134 where the material of the first conductive member 132 contacts the memory material of the memory member 110. The first interface structure 130 is also electrically and thermally coupled to access circuitry (not shown) including an isolation device such as a transistor or a diode. The first interface structure 130 has a thermal impedance between the memory member 110 and the access circuitry.

Second interface structure 140 comprises a second conductive member 142 and a contact area 144 where the material of the second conductive member 142 contacts the memory material of the memory member 110. The second interface structure 140 is also electrically and thermally coupled to a bit line structure (not shown) including a bit line. The second interface structure 140 has a thermal impedance between the memory member 110 and the bit line structure.

In operation, bias circuitry (See, for example, bias circuitry voltage and current sources 1255 of FIG. 12) applying voltages to the isolation device and the bit line can induce current to flow from the first interface structure 130 to the second interface structure 140, or vice-versa, via the memory member 110. As current passes between the first and second interface structures 130, 140 and through the memory member 110, a portion of memory member 110 called the active region 120 heats up more quickly than the remainder of the memory member 110.

During reset the memory cell 100 is subject to a reset pulse having a pulse length of time, the reset pulse applied by the bias circuitry to transform the active region 120 of the memory member 110 to an amorphous phase. This reset pulse is a relatively high energy pulse, sufficient to raise the temperature of at least the active region 120 above the transition (crystallization) temperature Tx of the memory material and also above the melting temperature Tm of the memory material, thus placing at least the active region 120 in a liquid state. The reset pulse is then terminated, resulting in a relatively quick quenching time as the active region 120 quickly cools from melting temperature Tm to below transition temperature Tx such that the active region 120 stabilizes in an amorphous phase.

In FIG. 1 the active region 120 of the memory member 110 occurs adjacent to the first interface structure 130 because of a significant difference in the thermal impedances of the first and second interface structures 130, 140. A significant thermal impedance difference can cause, for example, heat transfer from the memory member 110 through the first interface structure 130 during quenching that is much greater than heat transfer from the memory member 1100 through the second interface structure 140. This can result in the portion of the memory member 110 nearest the first interface structure 130 undergoing cooling at a faster rate than the rest of the memory member 110, such that the active region 120 is adjacent the first interface structure 130.

Since the phase change of the active region 120 occurs as a result of heating and because the interfaces between the memory element 110 and the first and second interface structures 130, 140 are generally weak points, an interface adjacent to the active region 120 will undergo high temperatures that can increase the risk of failure of the interface. Therefore, issues can arise with the reliability of the memory cell 100 if the active region 120 is adjacent to an interface structure 130, 140.

Also, due to the high thermal conductivity of the interface structures 130, 140, if the active region 120 is adjacent to an interface structure 130, 140 a significant amount of heat will be drawn away from the active region 120, resulting in the need for a larger amount of power to induce the desired phase change in the active region 120. However, if the active region 120 is spaced away from the first and second interface structures 130, 140, the remaining portions of the memory element 110 can provide some thermal isolation to the active region 120 and thus reduce the amount of power needed to induce a phase change.

It is desirable therefore to provide a memory cell structure having an active region spaced away from the first and second interface structures to improve reliability and a reduce the amount of power needed for reset, as well as methods for manufacturing such devices.

SUMMARY OF THE INVENTION

A memory device described herein includes access circuitry having a thermal impedance, and a bit line structure also having a thermal impedance. The memory device further includes a memory member comprising memory material contacting a first interface structure, the first interface structure electrically and thermally couples the memory member to the access circuitry and has a thermal impedance therebetween. A second interface structures also contacts the memory member, the second interface structure electrically and thermally couples the memory member to the bit line structure and has a thermal impedance therebetween. Bias circuitry is also included for applying a reset pulse to the access circuitry and to the bit line structure. The thermal impedances of the access circuitry and of the bit line structure are such that the temperature of each remain relatively constant compared to the temperature change of an active region of the memory member during the reset pulse. The thermal impedances of the first and second interface structures are essentially equal such that applying the reset pulse results in a phase transition of an active region of the memory member spaced away from both the first and second interface structures. In some embodiments the active region of the memory element is a significant distance away from the first and second interface structures. For example, the active region may occur essentially in the center of the memory element.

In one embodiment the first interface structure comprises a first conductive member having a first shape, and the second interface structure comprises a second conductive member having a second shape. The second shape is a mirror image of the first shape and the first conductive member consists essentially of the same materials as the second conductive member. As used herein, a shape is a mirror image if its parts are arranged as to present a reversal of the arrangement in another essentially similar thing. Mirror image shapes and using essentially the same materials for the first and second interface structures can result in the active region of the memory element being spaced a significant distance away from both of the interface structures, and may result in the active region being essentially in the center of the memory element.

A method for manufacturing a memory device described herein includes forming access circuitry having a thermal impedance, forming a bit line structure having a thermal impedance, and forming a memory member comprising a memory material. The method further includes forming a first interface structure contacting the memory member, the first interface structure electrically and thermally coupling the memory member to the access circuitry and having a first thermal impedance therebetween. A second interface structure contacting the memory member is formed, the second interface structure electrically and thermally coupling the memory member to the bit line structure and having a second thermal impedance therebetween. Bias circuitry formed for applying a reset pulse to the access circuitry and to the bit line structure, the reset pulse having a second thermal impedance therebetween. The thermal impedances of the access circuitry and of the bit line structure are such that the temperature of each remain relatively constant compared to the temperature change of an active region of the memory member during the reset pulse. The thermal impedances of the first and second interface structures are essentially equal such that applying the reset pulse results in a phase transition of an active region of the memory member spaced away from both the first and second interface structures.

Structures and methods of the present invention are disclosed in the detailed description below. This summary does not purport to define the invention. The invention is defined by the claims. These and other embodiments, features, aspects, and advantages of the invention will become better understood with reference to the following description, appended claims and accompanying drawings.

DETAILED DESCRIPTION

A detailed description is provided with reference to FIGS. 2-13.

Figure 1:
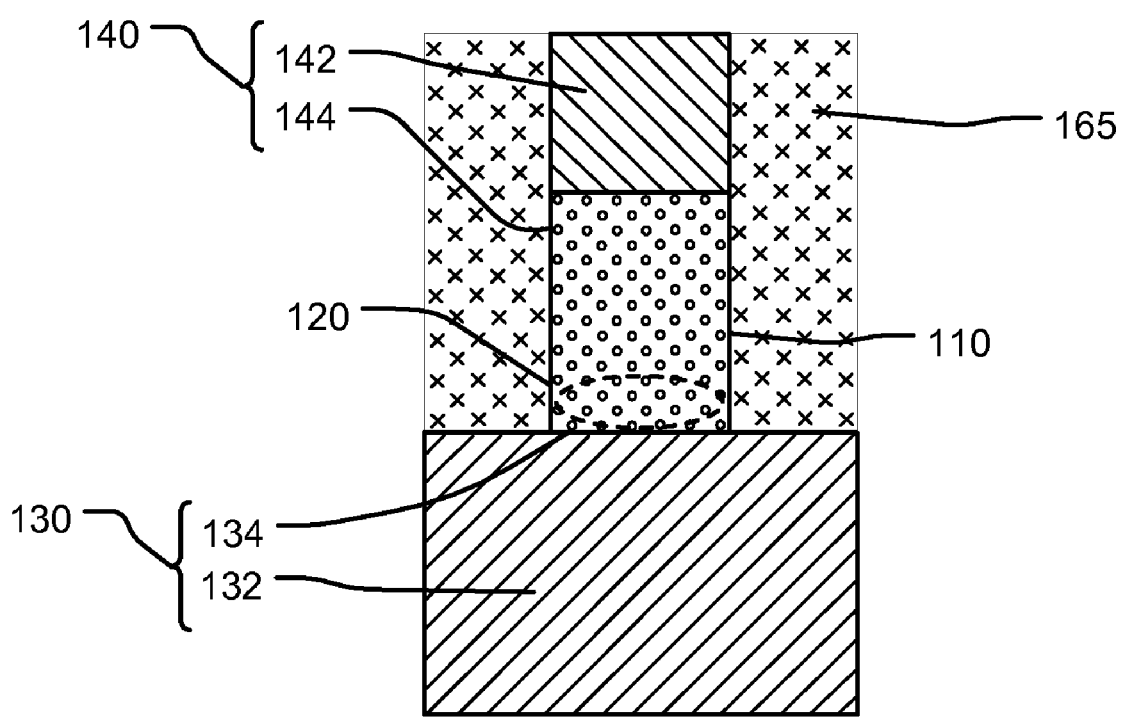
FIG. 1 illustrates a cross-sectional view of a portion of a prior art memory cell.
Figure 2:
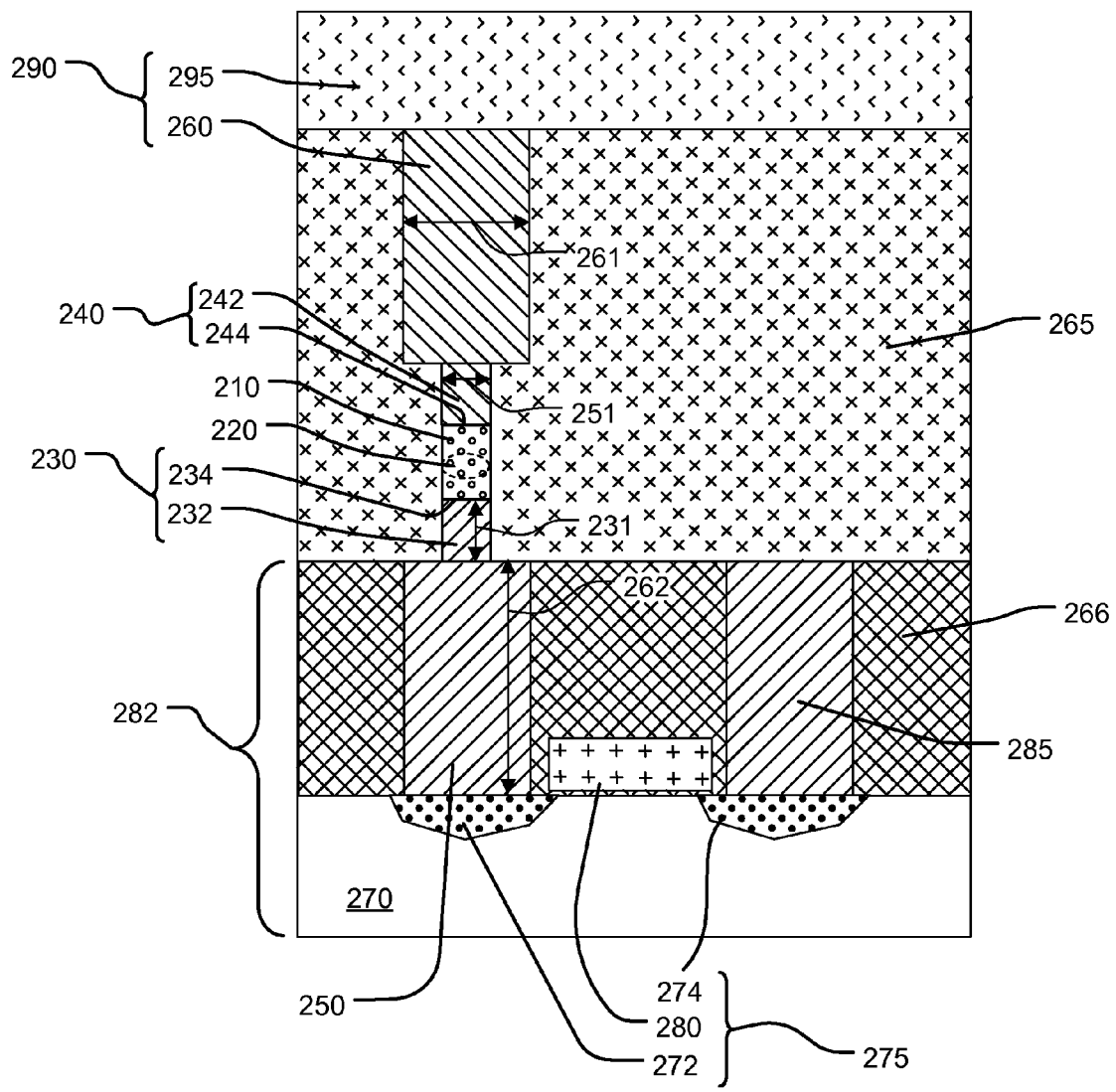
FIG. 2 illustrates a cross-sectional view of an embodiment of a memory cell including a memory member having an active region spaced away from both a first interface structure and a second interface structure.

FIG. 2 illustrates a cross-sectional view of an embodiment of a memory cell 200 including a memory member 210 comprising memory material having an active region 220 spaced away from both a first interface structure 230 and a second interface structure 240. The memory member 210 makes electrical and thermal contact with the first interface structure 230, and also makes electrical and thermal contact with the second interface structure 240. The memory member 210 is surrounded by a dielectric 265 that acts to provide some thermal isolation to the memory member 210 and to the first and second interface structures 230, 240. The memory member 210 is cylindrical with a cross-section that is circular, oval, square, or other shape.

First interface structure 230 comprises a first conductive member 232 and a contact area 234 where the material of the first conductive member 232 contacts the memory material of the memory member 210. The first interface structure 230 is also electrically and thermally coupled to access circuitry 282 including conductive plug 250 and isolation device 275. The first conductive member 232 is also cylindrical with a cross-section matching that of the memory member 210.

The isolation device 275 includes a word line 280 as the gate, doped regions 272, 274 in substrate 270 as drain and source regions respectively, and a source line 285 contacting the doped region 274. The conductive plug 250 contacts the doped region 272 of access device 275 and extends through dielectric layer 266 to contact first conductive member 232.

Second interface structure 240 comprises a second conductive member 242 and a contact area 244 where the material of the second conductive member 242 contacts the memory material of the memory member 210. The second interface structure 240 is also electrically and thermally coupled to bit line structure 290 including conductive plug 260 and bit line 295. The conductive plug 260 contacts the bit line 295 and the second conductive member 242. The second conductive member 242 is also cylindrical with a cross-section matching that of the memory member 210.

The word line 280 and the source line 285 extend in parallel in a direction perpendicular to the cross-section illustrated in FIG. 2, and bit line 295 extends in a direction parallel to the cross-section illustrated in FIG. 2.

Figure 12:
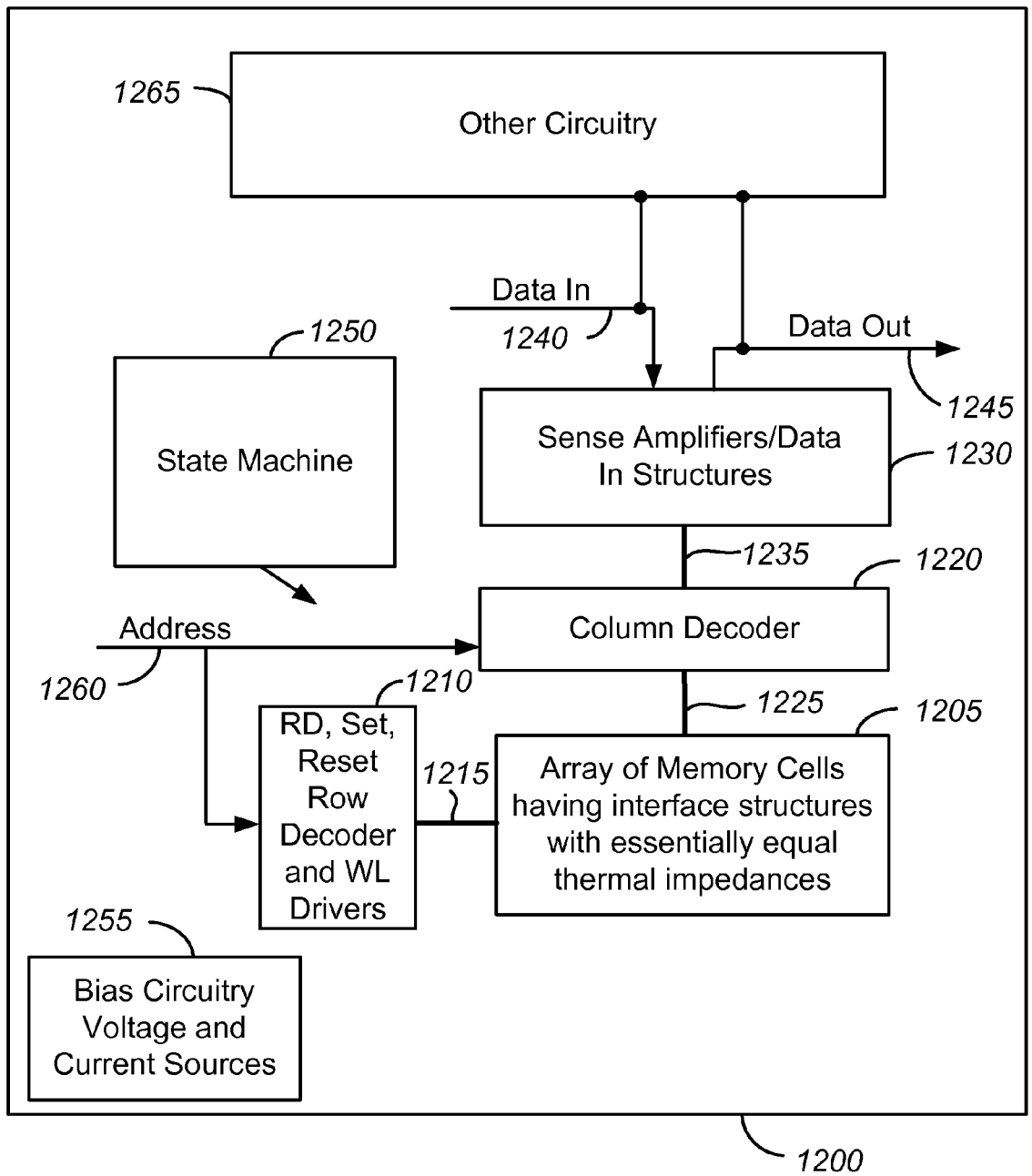
FIG. 12 is a simplified block diagram of an integrated circuit including an array of memory cells as described herein.

During reset of the memory cell 200, bias circuitry (See, for example, bias circuitry voltage and current sources 1255 of FIG. 12) applies a reset pulse having a pulse length of time to the access circuitry 282 and the bit line structure 290, the reset pulse inducing current to flow from the first interface structure 230 to the second interface structure 240, or vice-versa, via the memory member 210. As the current passes through the first and second interface structures 230, 240 and the memory member 210, the active region 220 heats up more quickly than the remainder of the memory member 210. The reset pulse is sufficient to raise the temperature of at least the active region 210 above the transition (crystallization) temperature Tx of the memory material and also above the melting temperature Tm of the memory material, thus placing the active region 220 in a liquid state. The reset pulse is then terminated, resulting in the active region 220 cooling from melting temperature Tm to below transition temperature Tx such that the active region 220 stabilizes in an amorphous phase. As is described in more detail below with reference to FIG. 3, the thermal impedance of the first interface structure 230 between the memory member 210 and the access circuitry 282, and the thermal impedance of the second interface structure 240 between the memory member 210 and the bit line structure 290, effect the location of the active region 220 of the memory member 210.

Figure 3:
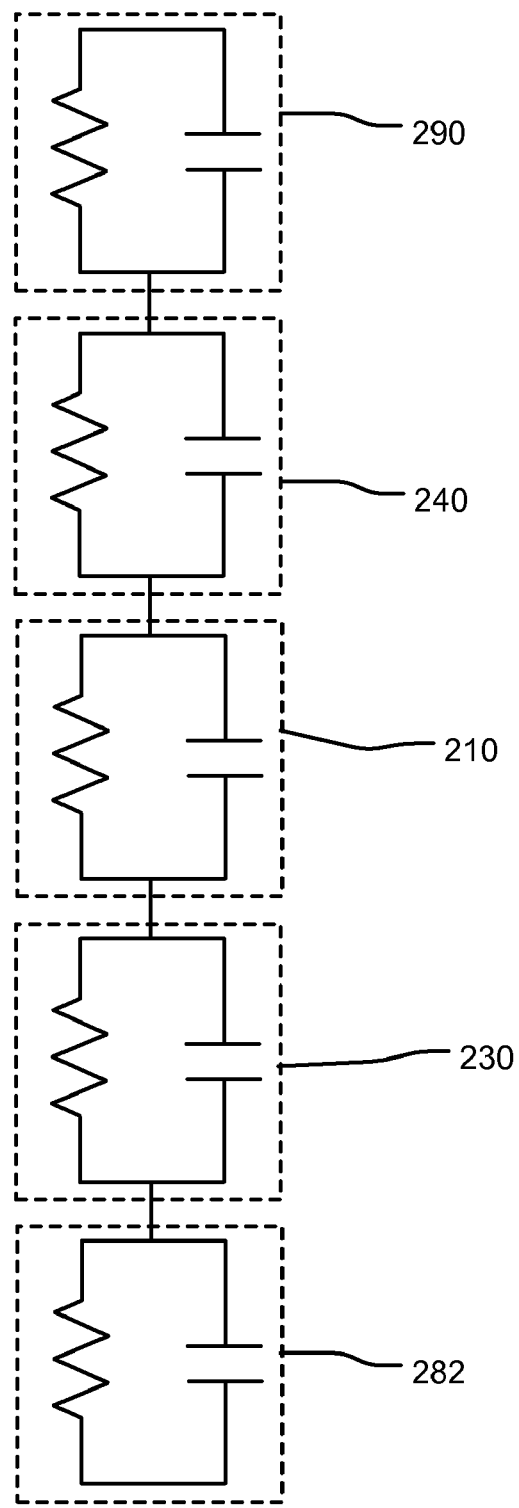
FIG. 3 is a simplified equivalent thermal circuit diagram of the memory cell illustrated in FIG. 2.

FIG. 3 is a simplified equivalent thermal circuit diagram of the memory cell 200 illustrated in FIG. 2. As illustrated in FIG. 3, the memory member 210, the first interface structure 230, the second interface structure 240, the access circuitry 282, and the bit line structure 290 are each represented by a thermal impedance including a thermal resistance in parallel with a thermal capacitance.

Thermal resistance as used herein is a measure of an element's ability to prevent heat from flowing through it. Thermal capacitance as used herein is a measure of an element's capability of accumulating heat. The thermal resistance and capacitance of an element each depend upon many variables including material properties, shape of the element, and the size and quality of contacts that permit heat flow between the element and adjacent elements.

The access circuitry 282 and the bit line structure 290 have thermal impedances including relatively large thermal capacitances such that the temperature of the access circuitry 282 and the temperature of the bit line structure 290 remain relatively constant compared to the temperature change of the active region 220 of the memory member 210 during reset.

Because of the relatively constant temperatures of the access circuitry 282 and the bit line structure 290 during reset, the thermal impedances of the first and second interface structures 230, 240 effect how the memory member 210 heats up and cools down during reset, thereby determining the location of the active region 220 relative to the first and second interface structures 230, 240. When the thermal impedances of the first and second interface structures 230, 240 are essentially equal the active region 220 will be spaced away from both the first and second interface structures 230, 240.

Referring back to FIG. 2, the thermal impedances of the first and second interface structures 230, 240 are essentially equal because the first and second interface structures 230, 240 are substantially symmetrical structures (mirror-images) including having the same material for the first and second conductive members 232, 242, substantially the same widths 251 for the first and second conductive members 232, 242, substantially the same thicknesses 231 for the first and second conductive members 232, 242, and substantially the same contact areas 234, 244. Additionally, plugs 250, 260 preferably have substantially the same widths 261 and are made of the same material so that the contact area and the quality of the contact between the plugs 250, 260 and the first and second interface structures 230, 240 are essentially the same.

It will be understood that a wide variety of materials can be utilized in implementation of the first and conductive members 232, 242 and plugs 250, 260, including metals such as aluminum, titanium nitride, and tungsten based materials as well as non-metal conductive material such as doped polysilicon. The first and second conductive members 232, 242 in the illustrated embodiment are preferably TiN or TaN, and the plugs 250, 260 are preferably formed from a refractory metal such as tungsten W. Alternatively, the first and second conductive members 232, 242 and plugs 250, 260 may comprise TiAlN or TaAlN, or comprise, for further examples, one or more elements selected from the group consisting of Ti, W, Mo, Al, Ta, Cu, Pt, Ir, La, Ni, N, O and Ru and combinations thereof. It is preferred that all or part of the first and second conductive members 230, 240 in contact with the memory member 210 comprise a material selected for compatibility with the memory material of the memory member 210. TiN may be preferred because it makes a good contact with GST (discussed below) as a memory material, it is a common material used in semiconductor manufacturing, and it provides a good diffusion barrier at the higher temperatures at which GST transitions, typically in the 600-700 degree Celsius range.

Embodiments of the memory cell 200 include phase change based memory materials, including chalcogenide based materials and other materials, for the memory member 210. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, for example U.S. Pat. No. 6,800,504, and U.S. Patent Application Publication No. US 2005/0029502.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Representative chalcogenide material can be characterized as follows: $Ge_xSb_yTe_z$, where x:y:z=2:2:5. Other compositions can be used with x: 0~5; y: 0~5; z: 0~10. GeSbTe with doping, such as N—, Si—, Ti—, P—, As— or other element doping may also be used. These materials can be formed by PVD sputtering or magnetron-sputtering method with reactive gases of Ar, $N_2$, and/or He, etc and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens to several hundreds of volts is also used. Also, the combination of DC bias and the collimator can be used simultaneously. The post deposition annealing treatment with vacuum or N2 ambient is sometimes needed to improve the crystallize state of chalcogenide material. The annealing temperature typically ranges 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

Figure 4:
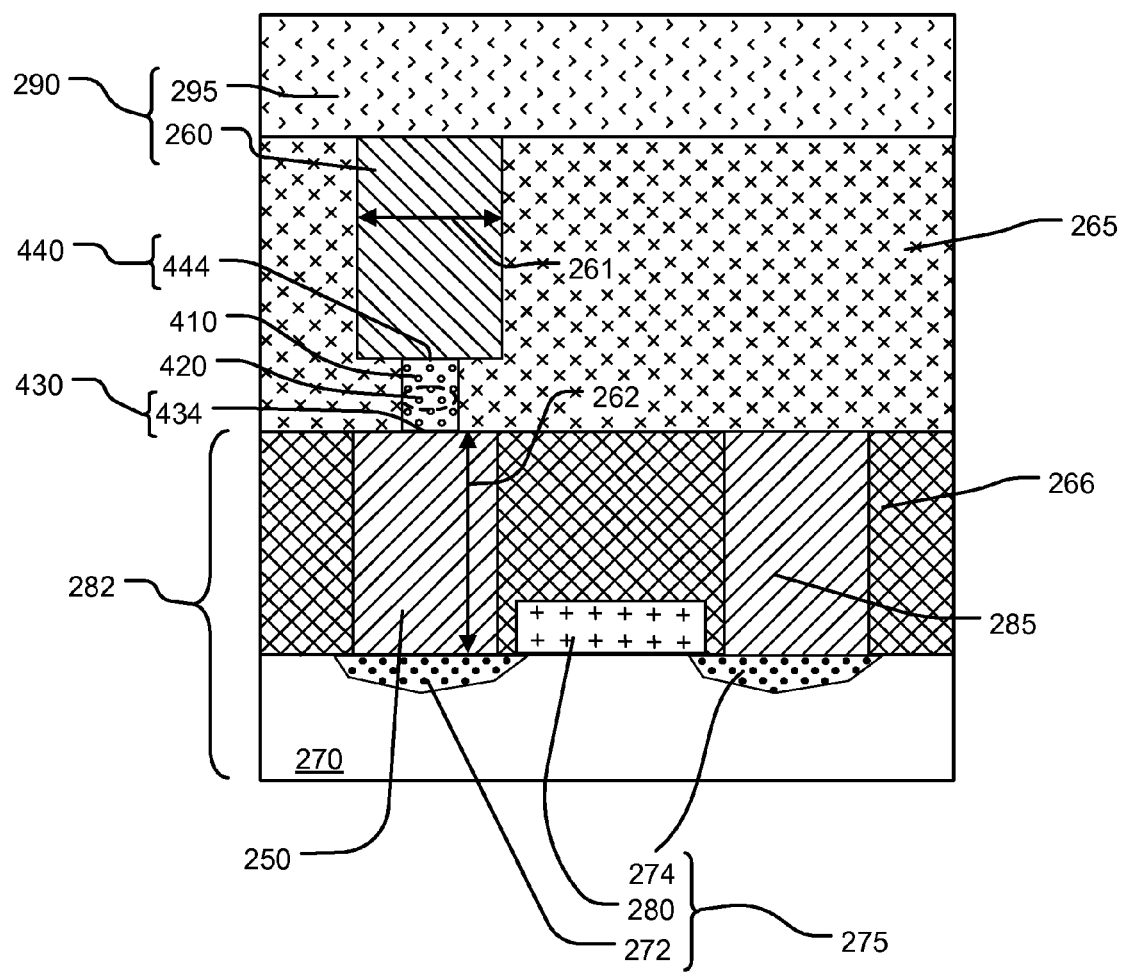
FIG. 4 illustrates a cross-sectional view of a second embodiment of a memory cell.

FIG. 4 illustrates a cross-sectional view of a second embodiment of a memory cell 400 including a memory member 410 comprising memory material having an active region 420 spaced away from both a first interface structure 430 and a second interface structure 440. The memory member 410 is cylindrical with a cross-section that is circular, oval, square, or other shape. FIG. 4 is similar to the embodiment illustrated in FIG. 2 with the first and second conductive elements 232, 242 omitted.

The first interface structure 430 comprises a contact area 434 where the material of conductive plug 250 contacts the memory material of memory member 410. The second interface structure 440 comprises a contact area 444 where material of the plug 260 contacts the memory material of memory member 410. The plugs 250, 260 comprise the same material so that the contact quality of the contact areas 434, 444 are substantially the same. Additionally, plugs 250, 260 are preferably symmetrical structures (mirror-images) including having the same widths 261 and thicknesses 262.

The first interface structure 430 has a thermal impedance between the memory member 410 and the access circuitry 282, and the second interface structure 440 has a thermal impedance between the memory member 410 and the bit line structure 290. These thermal impedances are essentially equal because the contact areas 434, 444 are substantially the same and the contact quality of the contact areas 634, 644 are substantially the same.

Figure 5:
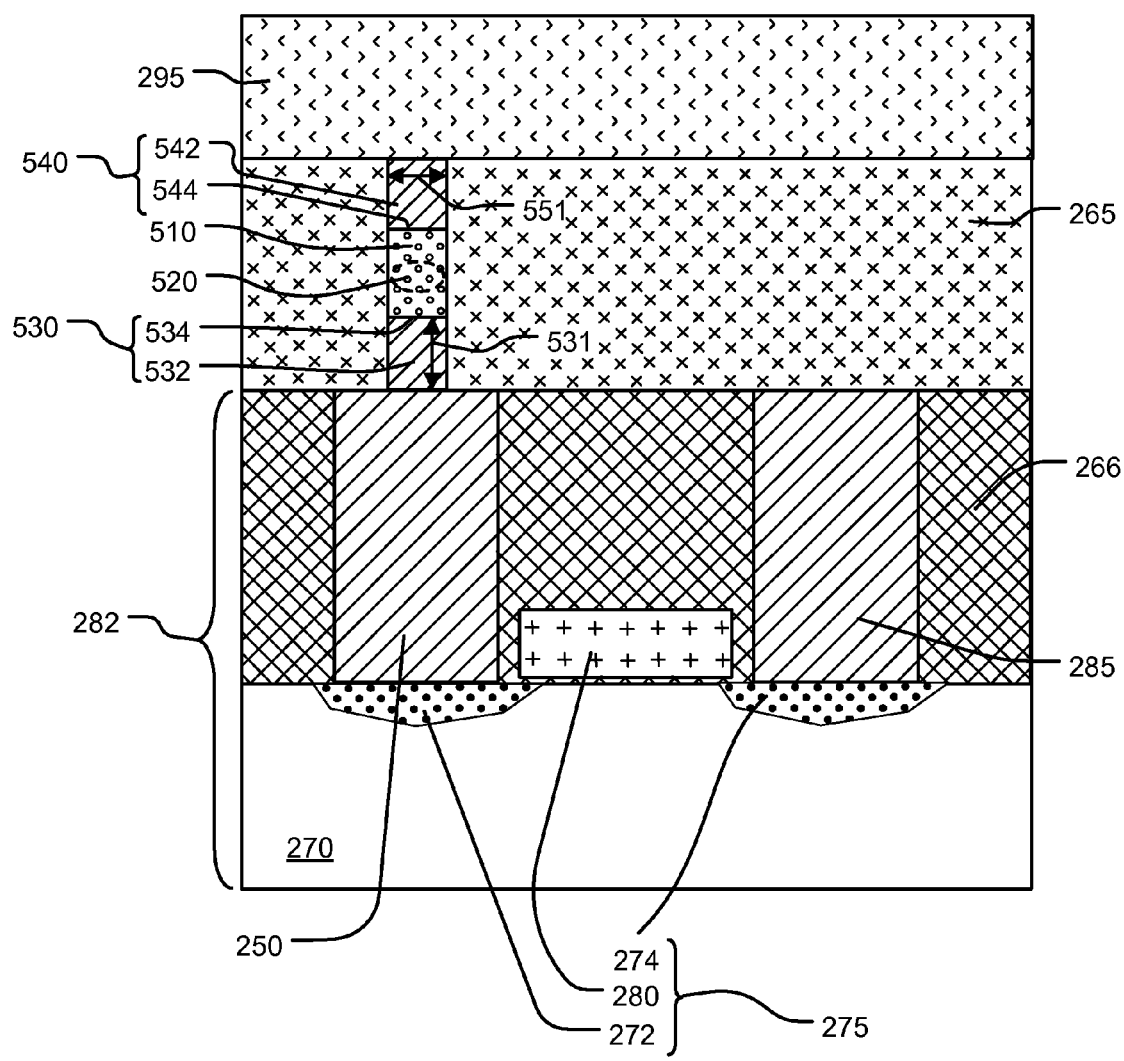
FIG. 5 illustrates a cross-sectional view of a portion of third embodiment of a memory cell.

FIG. 5 illustrates a cross-sectional view of a third embodiment of a memory cell 500 including memory member 510 comprising memory material having an active region 520 spaced away from both a first interface structure 530 and a second interface structure 540. The memory member 510 is cylindrical with a cross-section that is circular, oval, square, or other shape. FIG. 5 is similar to the embodiment illustrated in FIG. 2 with the plug 260 omitted.

First interface structure 530 comprises a first conductive member 532 and a contact area 534 where material of the first conductive member 532 contacts the memory material of the memory member 510. The first conductive member 532 is also cylindrical with a cross-section matching that of the memory member 510.

Second interface structure 540 comprises a second conductive member 542 and a contact area 544 where the material of the second conductive member 542 contacts the memory material of the memory member 510. The second conductive member 542 is also cylindrical with a cross-section matching that of the memory member 510.

The first interface structure 530 has a thermal impedance between the memory member 510 and the access circuitry 282, and the second interface structure 540 has a thermal impedance between the memory member 510 the bit line 295. These thermal impedances are essentially equal because the first and second interface structures 530, 540 are substantially symmetrical structures (mirror-images) including having the same material for the first and second conductive members 532, 542, substantially the same widths 551 for the first and second conductive members 532, 542, substantially the same thicknesses 531 for the first and second conductive members 532, 542, and substantially the same contact areas 234, 244.

Figure 6:
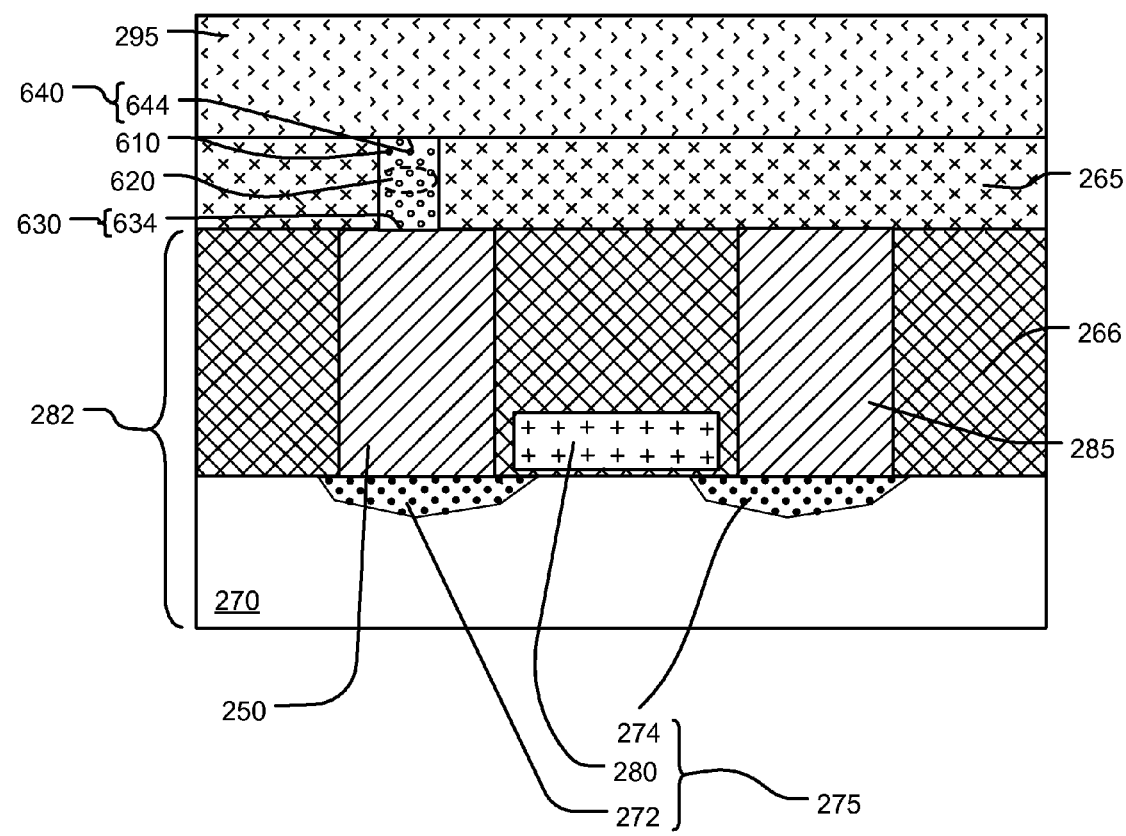
FIG. 6 illustrates a cross-sectional view of a portion of a fourth embodiment of a memory cell.

FIG. 6 illustrates a cross-sectional view of a fourth embodiment of a memory cell 600 including memory member 610 comprising memory material having an active region 620 spaced away from both a first interface structure 630 and a second interface structure 640. The memory member 610 is cylindrical with a cross-section that is circular, oval, square, or other shape. FIG. 6 is similar to the embodiment illustrated in FIG. 5 with the first and second conductive elements 532, 542 omitted.

The first interface structure 630 comprises a contact area 634 where the material of conductive plug 250 contacts the memory material of memory member 610. The second interface structure 640 comprises a contact area 644 where the material of bit line 295 contacts the memory material of memory member 610. The surface of bit line 295 and the surface of the plug 250 preferably comprise the same material, thus the contact quality of the contact areas 634, 644 are substantially the same.

The first interface structure 630 has a thermal impedance between the memory member 610 and the access circuitry 282, and the second interface structure 640 has a thermal impedance between the memory member 610 and the bit line 295. These thermal impedances are essentially equal because the contact areas 634, 644 are substantially the same and the contact quality of the contact areas 634, 644 are substantially the same. Although the thermal impedance of the bit line 295 may be different than that of the access circuitry 282, each have relatively large thermal capacitances such that the temperature of the access circuitry 282 and the temperature of the bit line 295 remain relatively constant compared to the temperature change of the active region 620 of the memory member 610 during reset. Thus, the active region 620 of the memory member 610 will be spaced away from both the first and second interface structures 630, 640.

Figure 7:
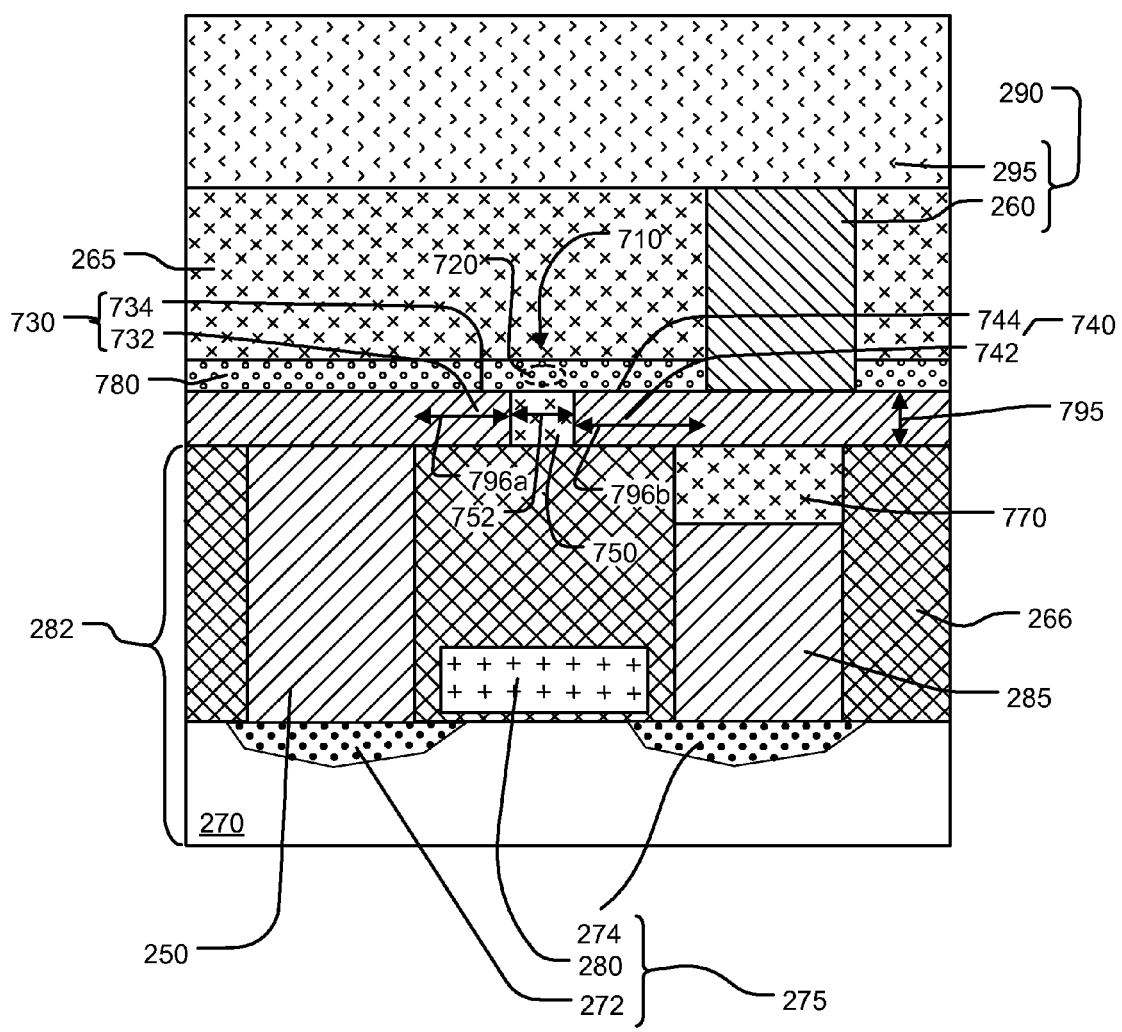
FIG. 7 illustrates a cross-sectional view of a portion of a fifth embodiment of a memory cell.

FIG. 7 illustrates a cross-sectional view of a fifth embodiment of a memory cell 700 including memory member 710 comprising memory material having an active region 720 spaced away from both a first interface structure 730 and a second interface structure 740. The first and second interface structures 730, 740 are separated by a dielectric spacer 750 having a width 752. The memory member 710 comprising a portion of a memory material layer 780 extends across the dielectric spacer 750 and contacts the first and second interface structures 730, 740. The memory member 710 defines an electrical current path between the first and second interface structure 730, 740 having a path length defined by the width 752 of the dielectric spacer 750.

The first interface structure 730 comprises a first conductive member 732 and a contact area 734 where material of the first conductive member 732 contacts memory material of the memory member 710. The second interface structure 740 comprises a second conductive member 742 and a contact area 744 where material of the second conductive member 742 contacts memory material of the memory member 710.

As can be seen in FIG. 7, the contact area between the memory layer 780 and the first conductive member 732 is different than the contact area between the memory layer 780 and the second conductive member 742. However, as explained below, this difference is not significant in determining the location of the active region 720.

In operation electrical current flows between plug 250 and plug 260 via the first and second conductive members 732, 742 and through the memory layer 780. Because the thermal and electrical conductivity of the first and second conductive members 732, 742 is greater than that of the memory layer 780, heat flow and electrical current in the memory layer 780 will be concentrated in the portion of the memory layer 780 extending across the dielectric spacer 750 and in the portions of the memory layer 780 overlying the regions of the first and second conductive members 732, 742 adjacent the dielectric spacer. Thus the contact areas 734, 744 are essentially the same for the purposes of heat flow and electrical conduction. In other words, the extra size of the contact area 734 does not significantly affect the thermal impedance of the interface structures 730.

Dielectric 770 thermally and electrically separates the source line 285 from the second conductive member 742.

The first interface structure 730 has a thermal impedance between the memory member 710 and the access circuitry 282, and the second interface structure 740 has a thermal impedance between the memory member 710 and the bit line structure 260. These thermal impedances are essentially equal because the first and second interface structures 730, 740 are essentially symmetrical structures including having the same material for the first and second conductive members 732, 742, substantially the same thicknesses 795 for the first and second conductive members, and substantially the same contact areas 734, 744. The plugs 250, 260 also respectively contact first and second conductive members 732, 742 at close to equal distances 796a,796b from the dielectric spacer 750, thereby helping to ensure that the first and second conductive members 732, 742 have essentially equal thermal impedances. Additionally, plugs 250, 260 preferably have the same widths and are made of the same material so that the contact areas and the quality of the contact regions between the plugs 250, 260 and the first and second interface structures 730, 740 are the same. Because the thermal and electrical conductivity of the first and second conductive members 732, 742 is greater than that of the memory layer 780, the location of the active region 710 is insensitive to small differences in the distances 796a, 796b.

FIGS. 8-11 illustrate cross-sectional views of an embodiment of a manufacturing process, the process resulting in the memory cell illustrated in FIG. 2.

Figure 8:
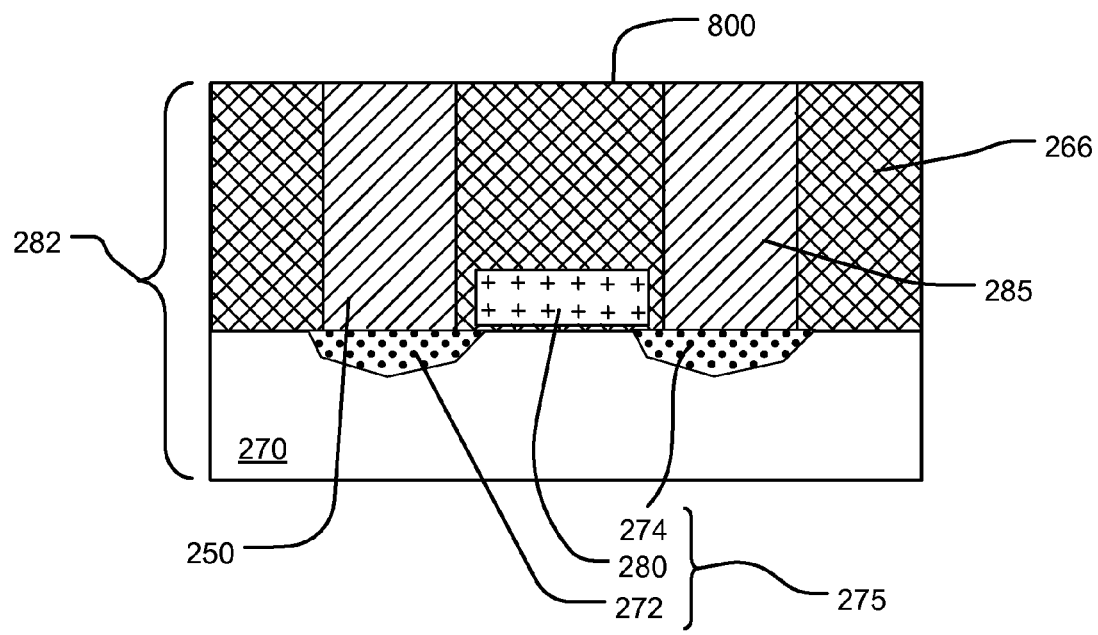
FIGS. 8-11 illustrate cross-sectional views of steps in a manufacturing process for manufacturing memory cells described herein.

FIG. 8 illustrates a first step in the process comprising providing access circuitry 282 having a top surface 800.

Figure 9:
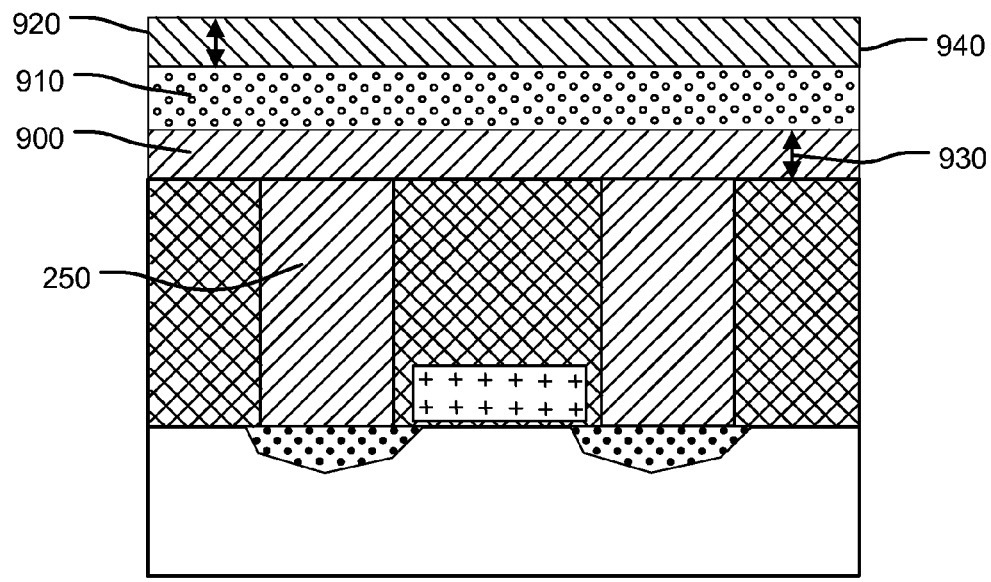

Next, a multi-layer structure is formed on the top surface 800 of FIG. 8, the multi-layer structure comprising a first conductive layer 900, a memory material layer 910, and a second conductive layer 920, resulting in the structure illustrated in FIG. 9. The first and second conductive layers 900, 920 comprise the same material, such as TiN, and have the same thicknesses 930, 940.

Figure 10:
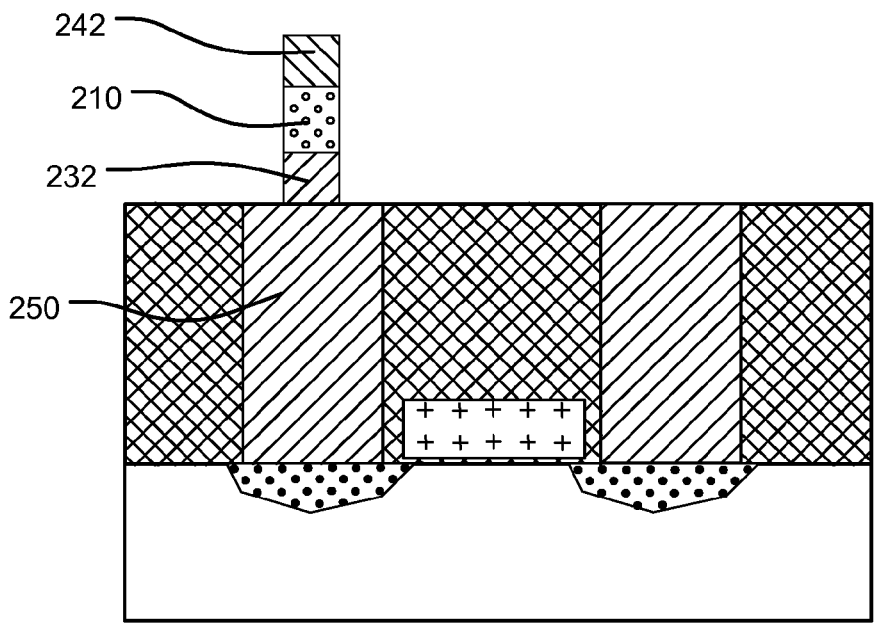

Next, etching is performed on the multi-layer structure illustrated in FIG. 9, thereby forming a first conductive member 232 comprising material from the first conductive layer 900 on the plug 250, a phase change member 210 comprising material from the memory material layer 910, and a second conductive member 242 comprising material from the second conductive layer 920, resulting in the structure illustrated in FIG. 10. The etching can be performed, for example, by patterning a pillar of photoresist on the second conductive layer (See ref. no. 920, FIG. 9), using the pillar of photoresist as an etch mask, and then removing the photoresist.

Figure 11:
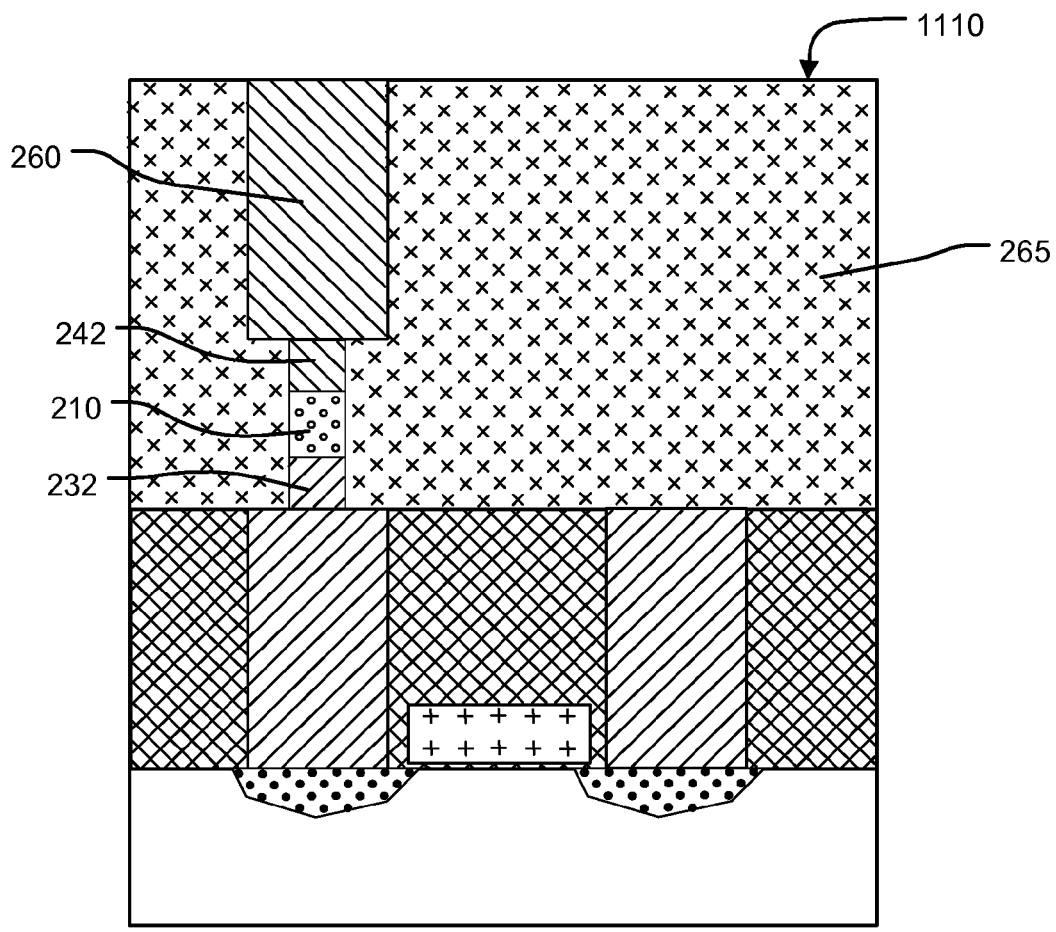

Next, dielectric fill layer 265 is formed on the structure illustrated in FIG. 10 and plug 260 is formed in electrical and thermal contact with the second conductive member 242 and extending to the top surface 1110 of the dielectric layer 265, resulting in the structure illustrated in FIG. 11.

Next a bit line 295 is formed on the top surface 1110 of the dielectric layer 265, resulting in the memory cell 200 illustrated in FIG. 2.

FIG. 12 is a simplified block diagram of an integrated circuit in accordance with an embodiment. The integrated circuit 1200 includes a memory array 1205 implemented using memory cells as described herein having interface structures with essentially equal thermal impedances. A row decoder 1210 having read, set and reset modes is coupled to a plurality of word lines 1215 arranged along rows in the memory array 1205. A column decoder 1220 is coupled to a plurality of bit lines 1225 arranged along columns in the memory array 1205 for reading, setting and resetting memory cells in the memory array 1205. Addresses are supplied on bus 1260 to column decoder 1220 and row decoder 1210. Sense amplifiers and data-in structures in block 1230, including current sources for the read, set and reset modes, are coupled to the column decoder 1220 via data bus 1235. Data is supplied via the data-in line 1240 from input/output ports on the integrated circuit 1200 or from other data sources internal or external to the integrated circuit 1200, to the data-in structures in block 1230. In the illustrated embodiment, other circuitry 1265 is included on the integrated circuit 1200, such as a general purpose processor or special purpose application circuitry, or a combination of modules providing system-on-a-chip functionality supported by the phase change memory cell array. Data is supplied via the data-out line 1245 from the sense amplifiers in block 1230 to input/output ports on the integrated circuit 1200, or to other data destinations internal or external to the integrated circuit 1200.

A controller implemented in this example using bias arrangement state machine 1250 controls the bias circuitry voltage and current sources 1255 for the application of bias arrangements including read, set, reset and verify voltages and or currents for the word lines and bit lines, and controls the word line/source line operation using an access control process. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 13:
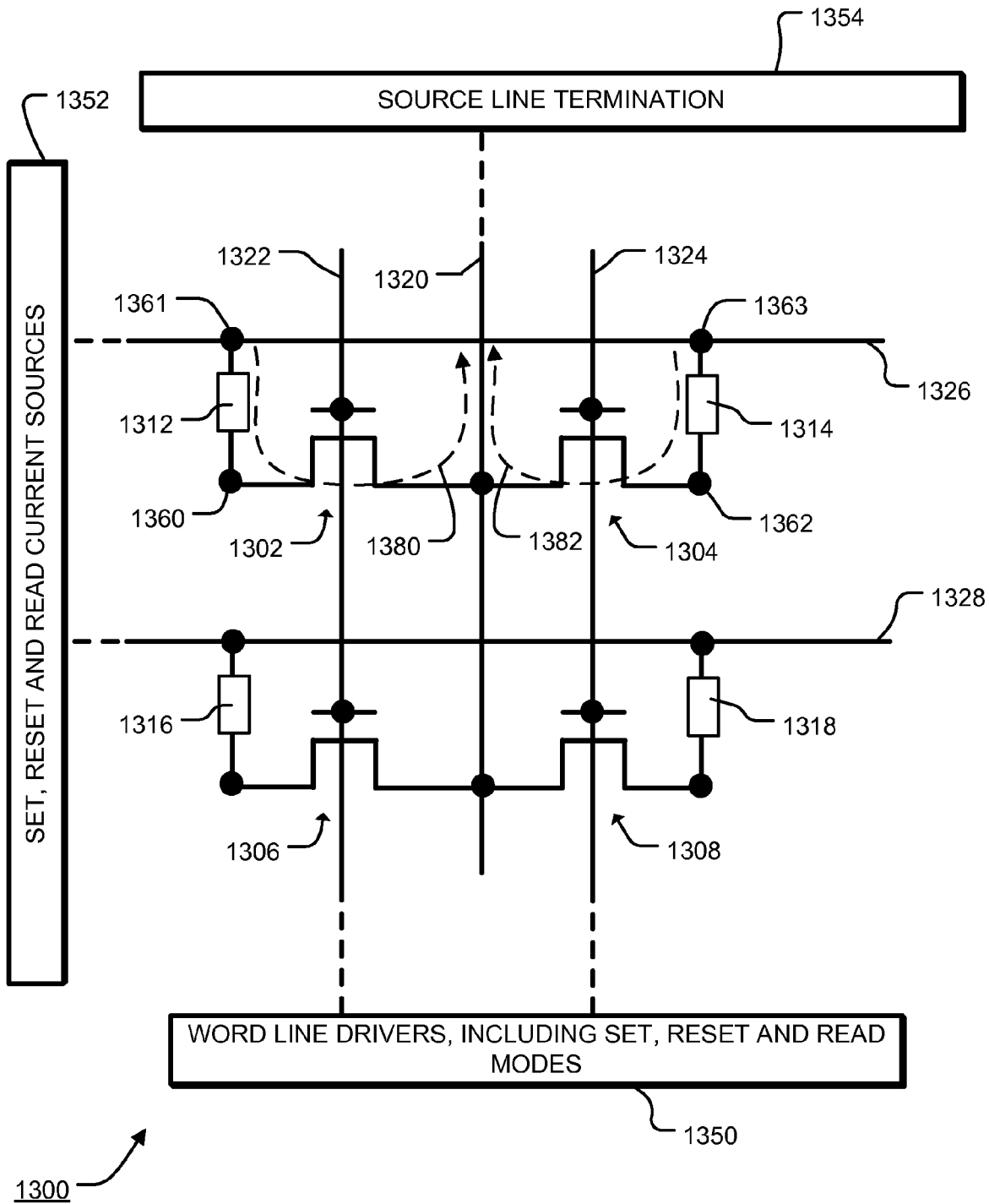
FIG. 13 is a schematic illustration of a memory array which can be implemented using memory cells described herein.

FIG. 13 is a schematic illustration of a memory array 1300, which can be implemented using memory cells as described herein. Four memory cells 1302, 1304, 1306, and 1308 having respective memory elements 1312, 1314, 1316, and 1318 are illustrated in FIG. 13, representing a small section of an array that can include millions of memory cells.

In the schematic illustration of FIG. 13, common source line 1320 and word lines 1322, 1324 are arranged generally parallel in the y-direction. Bit lines 1326, 1328 are arranged generally parallel in the x-direction. Thus, a y-decoder and a word line driver 1350, having set, reset, and read modes, are coupled to the word lines 1322, 1324. Bit line current sources 1352 for set, reset, and read modes, a decoder and sense amplifiers (not shown) are coupled to the bit lines 1326, 1328. The common source line 1320 is coupled to the source line termination circuit 1354, such as a ground terminal. The source line termination circuit 1354 may include bias circuitry such as voltage sources and current sources, and decoding circuits for applying bias arrangements, other than ground, to the source lines in some embodiments.

The common source line 1320 is coupled to the source terminals of memory cells 1302, 1304, 1306, and 1308. The word line 1322 is coupled to the gate terminals of memory cells 1302, 1306. The word line 1324 is coupled to the gate terminals of memory cells 1304, 1308.

Memory cells 1302, 1304 including respective memory elements 1312, 1314 are representative. The drain of memory cell 1302 is coupled to the first interface structure 1360 for memory element 1312, which in turn is coupled to the second interface structure 1361. Likewise, the drain of memory cell 1304 is coupled to the first interface structure 1362 for memory element 1314, which in turn is coupled to the second interface structure 1363. The second interface structures 1361, 1363 are coupled to bit line 1326. In operation, current sources 1352 operate in a lower current read mode, one or more intermediate current set modes, and a higher current reset mode. During the higher current reset mode, a current path 1380 through the selected memory cell (e.g. memory cell 1302 including memory element 1312) is established by applying a voltage and current to the bit line 1326, and voltages on the word line 1322 and source line 1320 sufficient to turn on the access transistor to memory cell 1302, so that the current flows through the source line 1320.

Likewise, during the lower current read mode, a current path 1382 through the selected memory cell (see the memory cell 1304 including memory element 1314) is established by applying a voltage and current to the bit line 1326, and voltages on the word line 1324 and source line 1320 sufficient to turn on the access transistor of memory cell 1304 and provide for current flow to the source line 1320.

During set mode, used for one or more intermediate current levels, an access transistor is enabled, as just described with respect to the read mode.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

Any and all patents, patent applications and printed publications referred to above are hereby incorporated by reference.

What is claimed is:

1. A memory device comprising:
   access circuitry comprising an isolation device, the access circuitry having a thermal impedance;
   a bit line structure comprising a bit line, the bit line structure having a thermal impedance;
   a memory member comprising a memory material having at least two solid phases;
   a first interface structure coupling the memory member to the access circuitry and having a first thermal impedance;
   a second interface structure coupling the memory member to the bit line structure and having a second thermal impedance; and
   bias circuitry for applying a reset pulse to the access circuitry and to the bit line structure, the reset pulse having a pulse length;
   wherein the thermal impedance of the access circuitry and the thermal impedance of the bit line structure are such that the temperature of the access circuitry and the temperature of the bit line structure remain relatively constant during the pulse length of the reset pulse, and the first and second thermal impedances are essentially equal such that applying the reset pulse results in a phase transition of an active region of the memory member spaced away from both the first and second interface structures.

2. The device of claim 1, wherein the access circuitry further comprises a conductive plug coupling the memory member to the access circuitry such that the first interface structure comprises a first contact area between the conductive plug and the memory member, and wherein the bit line contacts the memory member such that the second interface structure comprises a second contact area between the bit line and the memory member, the first and second contact areas being substantially the same.

3. The device of claim 1, wherein the access circuitry further comprises a first conductive plug coupling the memory member to the access circuitry such that the first interface structure comprises a first contact area between the first conductive plug and the memory member, and wherein the bit line structure further comprises a second conductive plug coupling the memory member to the bit line structure such that the second interface structure comprises a second contact area between the second conductive plug and the memory member, the first and second contact areas being substantially the same.

4. The device of claim 1, wherein the first interface structure comprises a first conductive member contacting the memory member and a contact area between the first conductive member and the memory member, and wherein the second interface structure comprises a second conductive member contacting the memory member and a contact area between the second conductive member and the memory member, the first and second interface structures being substantially symmetrical structures.

5. The device of claim 4, wherein the access circuitry further comprises a first conductive plug contacting the first conductive member, and wherein the bit line contacts the second conductive member.

6. The device of claim 4, wherein the access circuitry further comprises a first conductive plug contacting the first conductive member, and wherein the bit line structure further comprises a second conductive plug contacting the second conductive member.

7. The device of claim 6, further comprising a dielectric spacer having a width between the first and second interface structures, wherein the memory member extends across the dielectric spacer to contact the first and second interface structures, thereby defining an inter-electrode path between the first and second interface structures having a path length defined by the width of the dielectric spacer.

8. The device of claim 1, wherein the at least two solid phases include a generally amorphous phase and a generally crystalline phase.

9. The device of claim 1, wherein the memory material comprises a combination of two or more materials from the group of Ge, Sb, Te, Se, In, Ti, Ga, Bi, Sn, Cu, Pd, Pb, Ag, S, Si, O, P, As, N, and Au.

10. The device of claim 4, wherein each of the first and second conductive members comprise an element chosen from a group consisting of Ti, W, Mo, Al, Ta, Cu, Pt, Ir, La, Ni, N, O, and Ru and combinations thereof.

11. A method for manufacturing a memory device, the method comprising:
 forming access circuitry comprising forming an isolation device, the access circuitry having a thermal impedance;
 forming a bit line structure comprising forming a bit line, the bit line structure having a thermal impedance;
 forming a memory member comprising a memory material having at least two solid phases;
 forming a first interface structure contacting the memory member, the first interface structure coupling the memory member to the access circuitry and having a first thermal impedance;
 forming a second interface structure contacting the memory member, the second interface structure coupling the memory member to the bit line structure and having a second thermal impedance; and
 forming bias circuitry for applying a reset pulse to the access circuitry and to the bit line structure, the reset pulse having a pulse length;
 wherein the thermal impedance of the access circuitry and the thermal impedance of the bit line structure are such that the temperature of the access circuitry and the temperature of the bit line structure remain relatively constant during the pulse length of the reset pulse, and the first and second thermal impedances are essentially equal such that applying the reset pulse results in a phase transition of an active region of the memory member spaced away from both the first and second interface structures.

12. The method of claim 11, wherein the forming the access circuitry step further comprises forming a conductive plug contacting the memory member such that the first interface structure comprises a first contact area between the conductive plug and the memory member, and wherein forming the bit line structure step comprises forming the bit line in contact with the memory member such that the second interface structure comprises a second contact area between the bit line and the memory member, the first and second contact areas being substantially the same.

13. The method of claim 11, wherein the forming the access circuitry step further comprises forming a first conductive plug contacting the memory member such that the first interface structure comprises a first contact area between the first conductive plug and the memory member, and wherein the forming the bit line structure step further comprises forming a second conductive plug contacting the memory member such that the second interface structure comprises a second contact area between the second conductive plug and the memory member, the first and second contact areas being substantially the same.

14. The method of claim 11, wherein the forming the first interface structure step comprises forming a first conductive member contacting the memory member, thereby forming a contact area between the first conductive member and the memory member, and wherein the forming the second interface structure step comprises forming a second conductive member contacting the memory member, thereby forming a contact area between the second conductive member and the memory member, the first and second interface structures being substantially symmetrical structures.

15. The method of claim 14, wherein the forming the access circuitry step further comprises forming a first conductive plug contacting the first conductive member, and wherein the forming the bit line structure step comprises forming the bit line contacting the second conductive member.

16. The method of claim 14, wherein the forming the access circuitry step further comprises forming a first conductive plug contacting the first conductive member, and wherein the forming the bit line structure step further comprises forming a second conductive plug contacting the second conductive member.

17. The method of claim 16, further comprising forming a dielectric spacer having a width between the first and second interface structures, wherein forming the memory member step comprises forming the memory member extending across the dielectric spacer such that the memory member contacts the first and second interface structures, thereby defining an inter-electrode path between the first and second interface structures having a path length defined by the width of the dielectric spacer.

18. The method of claim 11, wherein the memory material comprises a combination of two or more materials from the group consisting of Ge, Sb, Te, Se, In, Ti, Ga, Bi, Sn, Cu, Pd, Pb, Ag, S, Si, O, P, As, N and Au.

19. The method of claim 14, wherein each of the first and second conductive members comprise an element chosen from a group consisting of Ti, W, Mo, Al, Ta, Cu, Pt, Ir, La, Ni, N, and O and Ru and combinations thereof.

20. A memory device comprising:
 access circuitry comprising an isolation device;
 a bit line structure comprising a bit line;
 a memory member comprising a memory material having at least two solid phases;
 a first interface structure coupling the memory member to the access circuitry, the first interface structure comprising a first conductive member having a first shape;
 a second interface structure coupling the memory member to the bit line structure, the second interface structure comprising a second conductive member having a second shape, wherein the second shape is a mirror image of the first shape and the first conductive member consists of the same materials as the second conductive member; and
 bias circuitry for applying a reset pulse to the access circuitry and to the bit line structure, such that applying the reset pulse results in a phase transition of an active region of the memory member spaced away from both the first and second interface structures.

* * * * *